United States Patent
Scheelen

(10) Patent No.: US 6,204,750 B1
(45) Date of Patent: Mar. 20, 2001

(54) INTERROGATOR FOR ELECTRONIC IDENTIFICATION SYSTEM

(75) Inventor: Jos Scheelen, Mol (BE)

(73) Assignee: British Technology Group Inter-Corporate Licensing Limited, London (GB)

( * ) Notice: Subject to any disclaimer, the term of this patent is extended or adjusted under 35 U.S.C. 154(b) by 0 days.

(21) Appl. No.: 08/958,491

(22) Filed: Oct. 27, 1997

(30) Foreign Application Priority Data

Apr. 27, 1995 (GB) .................................... 9508600
Jun. 1, 1995 (GB) .................................... 9511085
Apr. 26, 1996 (WO) ................... PCT/GB96/01013

(51) Int. Cl.⁷ ..................................... H04Q 5/22
(52) U.S. Cl. ............................ 340/10.1; 375/371; 327/23; 455/113; 455/12.1; 340/825.54; 342/358
(58) Field of Search ................. 375/371; 327/23; 455/113, 12.1; 340/825.5, 10.1; 342/358

(56) References Cited

U.S. PATENT DOCUMENTS

| | | | |
|---|---|---|---|
| 4,562,437 | * | 12/1985 | Sasaki et al. . |
| 4,725,841 | * | 2/1988 | Nysen et al. .................... 340/825.54 |
| 4,751,469 | | 6/1988 | Nakagawa et al. .................... 327/23 |
| 4,904,964 | * | 2/1990 | Peng et al. . |
| 4,949,361 | | 8/1990 | Jackson .................................. 375/371 |
| 5,331,669 | | 7/1994 | Wang et al. ........................ 375/371 |

FOREIGN PATENT DOCUMENTS

| | | |
|---|---|---|
| 0 006 691 | 1/1980 | (EP) . |
| 0 253 368 | 1/1988 | (EP) . |
| 0 309 201 | 3/1989 | (EP) . |
| 0 353 807 | 2/1990 | (EP) . |
| 0 374 018 | 6/1990 | (EP) . |
| 0 585 132 | 3/1994 | (EP) . |
| 0 613 253 | 8/1994 | (EP) . |
| 91 13499 | 9/1991 | (WO) . |

* cited by examiner

Primary Examiner—Michael Tokar
Assistant Examiner—Jean Bruner Jeanglaude
(74) Attorney, Agent, or Firm—Nixon & Vanderhye

(57) ABSTRACT

Interrogator for an electronic identification system having a first oscillator arranged to vary in frequency in accordance with the frequency of a received signal, a second oscillator arranged to vary in accordance with the frequency of the first oscillator after a delay of a number of cycles of the received signal, a phase discriminator for detecting the phase difference between respective output signals of the first and second oscillators and a phase-change detector arranged to determine the frequency at which the phase changes occur. In this way, a modulation frequency of the received signal can be determined.

9 Claims, 3 Drawing Sheets

INTERROGATOR FOR ELECTRONIC IDENTIFICATION SYSTEM

RELATED APPLICATIONS

Our co-pending patent application Ser. No. 9505350.0 filed on Mar. 16, 1995 includes a brief reference to an interrogator including a digital filter and capable of detecting small changes in Q factor, and the invention of this application may be applied in such an interrogator.

This invention relates to electronic identification systems, especially systems comprising an interrogator and one or more non-contact transponders.

BACKGROUND OF THE INVENTION

Interrogators and non-contact transponders are known, and one such system is disclosed in European Patent Application Publication No. 0 585 132, CSIR. In that application, a transponder is identified by synchronising an extracted data signal with a clock signal, but such an interrogator cannot detect small frequency changes in a system having a broad, flat Q factor. In EP 0 374 018 Etat Francais, a smart card detector incorporates a Colpitts oscillator of variable frequency, but the frequency variation is substantial and is dependent on two capacitors and the inductance when the detector is coupled to a smart card. Such a detector cannot detect small frequency changes.

SUMMARY OF THE INVENTION

According to the invention, an interrogator for an electronic identification system comprises a first oscillator arranged to vary in frequency in accordance with the frequency of a received signal; a second oscillator arranged to vary in accordance with the frequency of the first oscillator after a delay of a number of cycles of the received signal; and means to detect the phase difference between the first and second oscillators.

Said delay may be provided by the use of a loop filter in phase discriminator means.

The first oscillator may be sensitive to impedance changes and the second oscillator will then be insensitive to impedance changes. The first oscillator may be a Colpitts oscillator arranged to be unstable. The second oscillator may be a voltage controlled oscillator.

Preferably the interrogator further comprises phase-change detection means, such as a digital filter, which further measures the frequency at which the phase changes occur, such frequency measurements indicating the modulation frequency, and therefore the transponder identification signal of a non-contact transponder.

Preferably the input for the digital filter comprises an array of flipflop circuits; a delay line associated with each flipflop circuit and arranged so that the time delay provided by each delay line increases incrementally along the array; and means for providing signals from the Colpitts oscillator and the second oscillator as first and second clock signals, and for providing said clock signals to each flipflop/delay line pair so that when the phase difference between the clock signals corresponds to a time which is less than the time delay provided by a delay line, the associated flipflop circuit provides a first logical output, and when said time is greater than the time delay provided by a delay line, the associated flipflop circuit provides a second logical output.

Preferably there is further provided a second array of flipflop circuits and delay lines connected in opposition to the first array, so that if the first clock signal leads the second clock signal the logical output of the first array changes and if the first clock signal lags the second clock signal the logical output of the second array changes.

BRIEF DESCRIPTION OF THE DRAWINGS

The invention will now be described by way of example only with reference to the accompanying drawings in which.

DETAILED DESCRIPTION OF PREFERRED EMBODIMENTS

Figure 1:
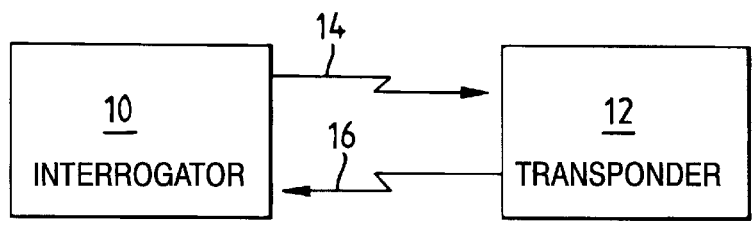
FIG. 1 illustrates in principle an electronic identification circuit.

In FIG. 1, an electronic identification circuit comprises an interrogator 10 and a passive transponder 12. The interrogator transmits power to the transponder, as indicated at 14, for example at 150 to 256 kHz, and the transponder utilises the power to reply with an identification signal 16, for example at a few hundred MHz, modulated in amplitude, frequency or phase by known techniques. For example the transponder modifies the frequency of the signal by changing the total Q factor of the system.

In our co-pending patent application No. 9505350.0 filed on Mar. 16, 1995, there is disclosed a transponder having a data transmit antenna which is modulated by shorting of its coil, so that the Q factor of the interrogator-transponder system varies. The construction of the antenna is such that the Q factor is broad and flat, so that detection of a small frequency change cannot be achieved by known techniques.

Figure 2:
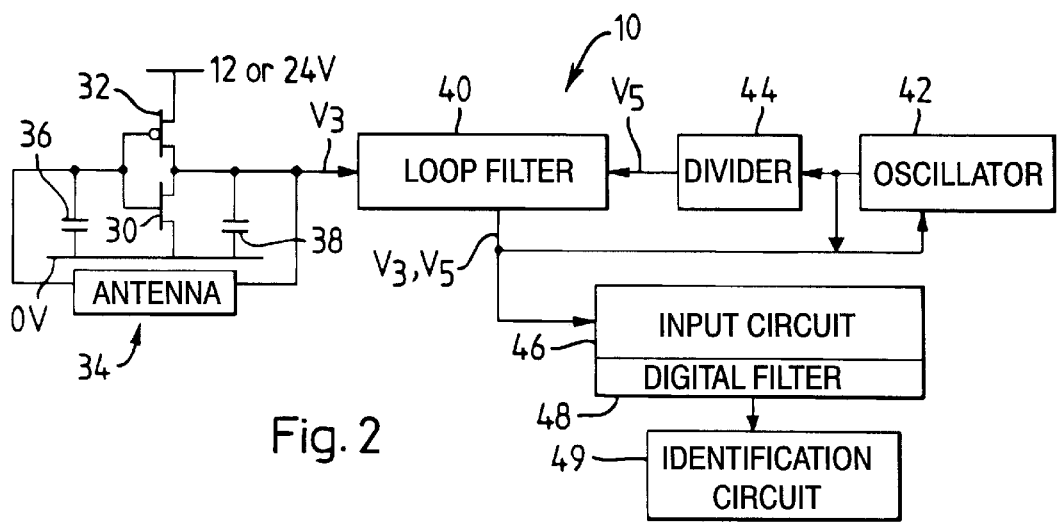
FIG. 2 illustrates in partial block diagram form an interrogator according to the invention.

FIG. 2 illustrates an interrogator circuit capable of detecting a small frequency change in such circumstances. The primary coil of the antenna 34 of the interrogator 10 is connected to an inverter circuit comprising two MOSFET transistors 30, 32, and each end of the coil of 34 is connected respectively to one of two capacitors 36, 38.

The circuit constitutes a Colpitts oscillator, and the values are chosen so that, contrary to conventional design principles, the oscillator is unstable. The inverter circuit has a large drive capability and therefore a large energy transmission.

Figure 3A:
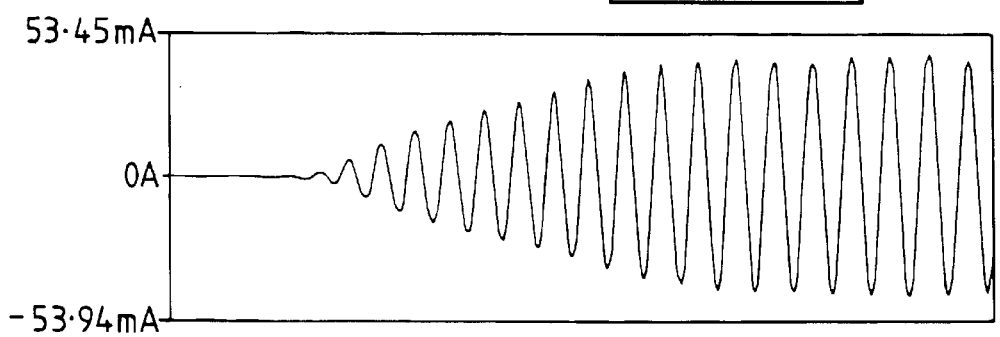
FIGS. 3($a$) and ($b$) illustrates the changes in current and voltage of the interrogator's antenna.
Figure 3B:
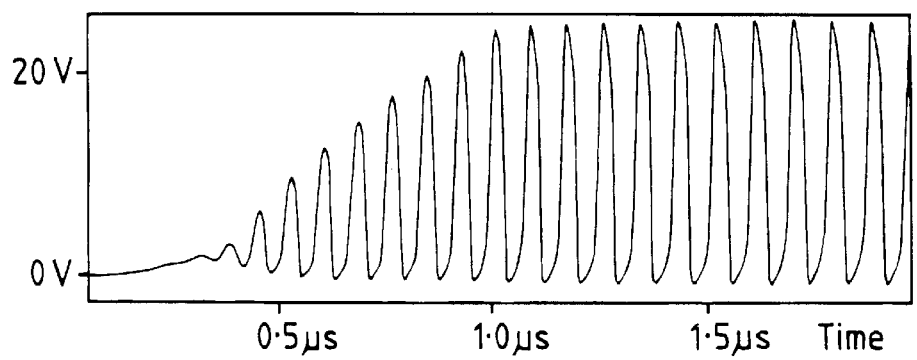

FIGS. 3($a$) and ($b$) are, respectively, plots of current through and voltage across the primary coil of 34 on start-up of the circuit; a stable position is quickly reached, and currents may be as high as ±50 mA.

The oscillator output, which is referenced $V_3$ in FIG. 2, is connected to a phase discriminator and loop filter 40 the output of which is connected to a voltage controlled oscillator (VCO) 42 and to the input circuit 46 of a digital filter 48. The VCO 42 supplies both a divider 44 and the input circuit 46. The digital filter 48 is connected to a data extraction and passive transponder identification circuit 49.

The VCO 42 typically comprises a capacitor and current injector, and, having no coil, is not sensitive to changes in frequency of the signal received by antenna 34. The VCO generates a frequency which is 8× the frequency of signal $V_3$ from the Colpitts oscillator, and the divider 44 divides this frequency by 8 for supply to the phase discriminator 40, indicated as reference $V_5$. The reason is that the digital filter 48 requires 8 clock pulses for every clock pulse received from the Colpitts oscillator.

In operation, the phase discriminator 40 supplies an error signal, and the VCO 42 operates to cancel the error, locking the VCO frequency to the frequency of the Colpitts oscillator.

Suppose now that the transponder 12 is modulated to change the Q factor of the system; the frequency of the Colpitts oscillator changes by a small value, and this frequency change is measured by utilising the error signal.

Figure 4A:
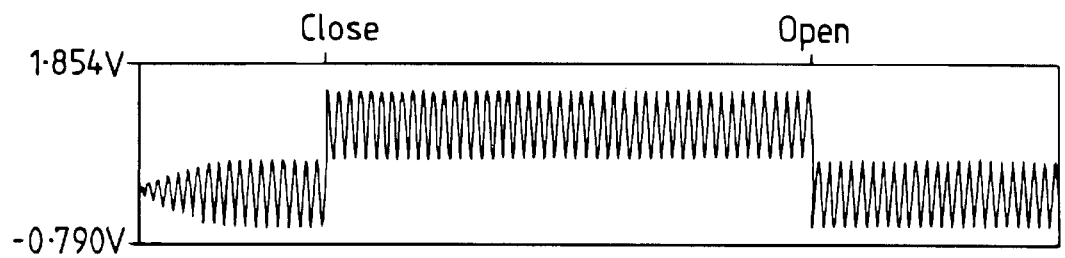
FIGS. 4($a$) and ($b$) illustrates respectively the voltage and frequency output of the Colpitts oscillator, and FIG. 4($c$) illustrates the resultant error signal.

The modulation is caused by closing and opening a switch in the transponder 12 to short a part of its data transmit coil, and the effect is illustrated in FIG. 4(a) which shows the voltage across the coil of antenna 34; as the switch is closed, the peak-to-peak voltage is unchanged, although the absolute signal magnitude changes; this is in marked contrast to prior art interrogator circuits which detect an absorption of energy and therefore suffer a considerable change in peak-to-peak signal. The effect of one switch closure and opening is shown, i.e. one databit of the transponder.

Figure 4B:
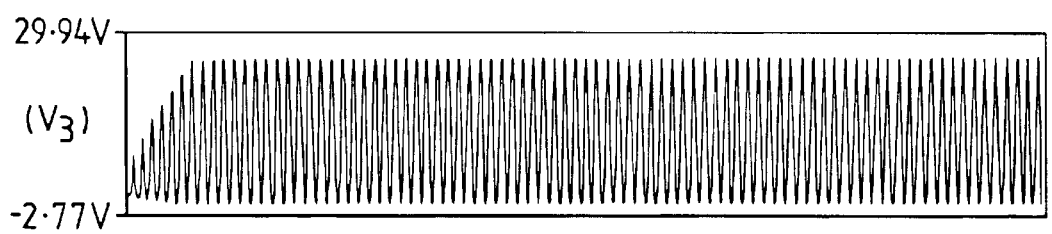
Figure 4C:
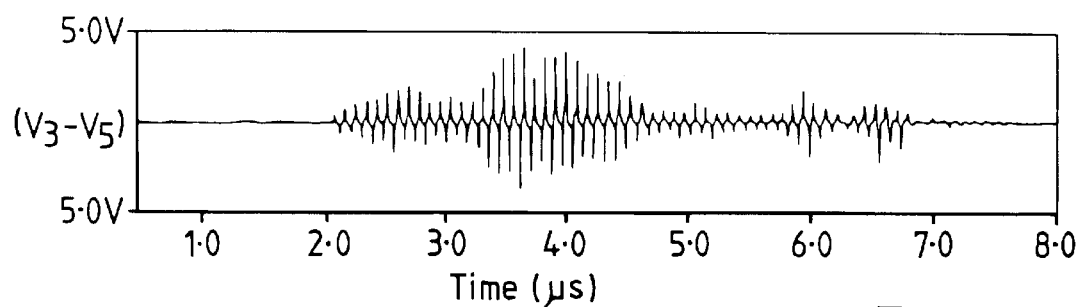

FIG. 4(b) shows the output of the Colpitts oscillator; there is in fact a small change in frequency, not easily visible in this figure, but illustrated in FIG. 4(c), which shows the output of the phase discriminator 44, (i.e. $V_3$–$V_5$) and therefore the input to the VCO 42 and to the input circuit 46.

Figure 5:
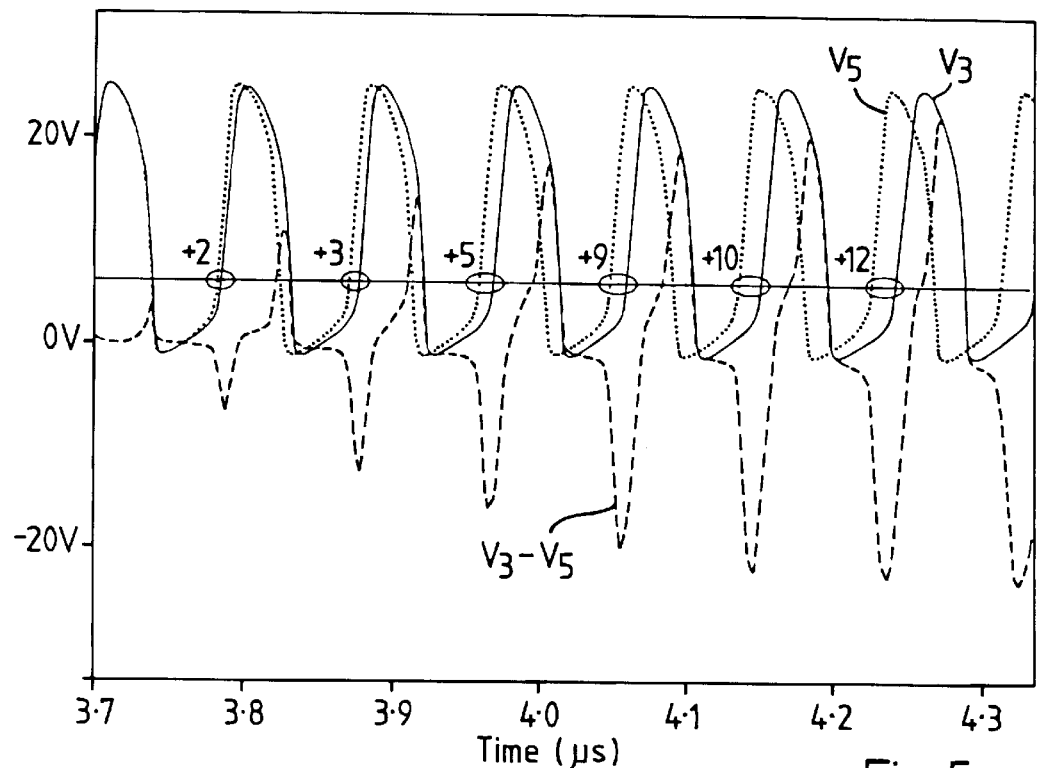
FIG. 5 illustrates the operation of the phase discriminator circuit.

FIG. 5 illustrates schematically the operation of the phase discriminator 40. The variations with time of $V_3$, the input from the Colpitts oscillator, of $V_5$, the input from the divider 44; and of $V_3$–$V_5$, the output of the phase discriminator 40, are shown. The two signals slowly drift apart. For clarity, the values are those which would be associated with a very large antenna coil in the transponder, which would not be used in practice.

If the error correction circuit were permitted to operate rapidly, the illustrated drifting apart would not occur, the VCO would rapidly follow the Colpitts signal and no delay or corresponding phase change could be measured. The presence of the loop filter in the discriminator 40 slows the process so that the correction is applied only after a few cycles, allowing the error, and therefore the frequency change of the Colpitts oscillator, to be detected.

Figure 6:
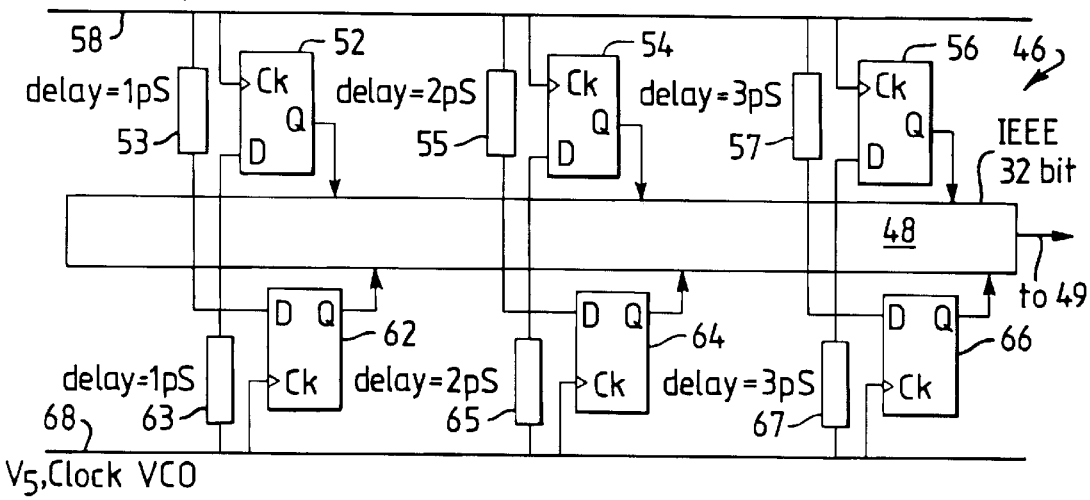
FIG. 6 illustrates the principle of a novel arrangement to provide the input to a digital filter.
Figure 6:
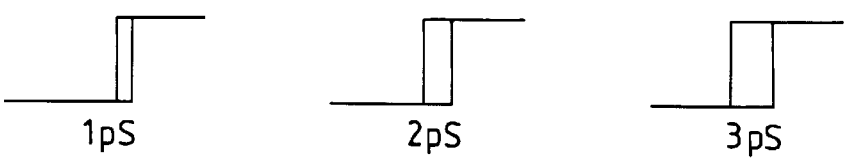

Referring now to FIG. 6, this illustrates the input circuit 46 which receives the two clock inputs $V_3$, $V_5$ for supply to the digital filter 48. The circuit functions to measure the time between the rising edges of the signals $V_3$ and $V_5$ shown in FIG. 5, and supplies it to the digital filter 48.

The Figure shows a number of flipflop circuits and delay lines arranged in two banks; it is believed that this circuit, which may be referred to as a clock bank circuit, is novel in any application.

The first bank comprises three identical flipflop circuits 52, 54, 56 each with a delay line 53, 55, 57 in parallel. The clock input of the flipflops and the delay lines are each supplied with the clock signal from the Colpitts oscillator (FIG. 2) on line 58, and the flipflop outputs are connected to a digital filter 48.

A second bank, a mirror image of the first bank, comprises three flipflop circuits 62, 64, 66 and delay lines 63, 65, 67 which are supplied on line 68 with the clock signal from the VCO 42 (FIG. 2). Each delay line is cross-connected to the corresponding flipflop in the other bank.

Although three flipflops and delay lines are illustrated in each bank, in practice a much larger number, e.g. 100 or 200, would be provided, to give the required degree of accuracy.

The delay lines are arranged so that in the upper and lower banks in the Figure, each line provides a delay which differs by one unit, for example by 1 picosecond, from the previous delay line; cumulative delays of 1, 2 and 3 picoseconds are shown.

Considering first the upper bank, on every rising edge of the clock signal $V_3$, the Colpitts clock signal is written to Q on every flipflop. If the VCO clock signal is slower than the Colpitts clock by a time falling between the time delays provided by consecutive delay lines, say lines 55 and 57, then flipflop 55 will provide an output 1 and flipflop 57 will provide an output 0; in a larger array, all flipflops "downstream" of 55 would output 1 and all flipflops "upstream" of 57 would output 0.

If the VCO clock signal is faster than the Colpitts clock signal, then the lower bank of flipflops and delay lines indicates the delay time. The non-operative bank provides an unchanged logical output in each case.

The outputs of all the flipflop circuits in both banks are connected to the digital filter 48; this can be designed on known principles as an IEEE 32 bit floating point digital filter, and its output indicates the time delay between the clock signals which has therefore been measured by use of an error signal generated from their phase difference.

In a non-contact transponder sending an identification signal the modulation illustrated in FIG. 4(a) causes the Colpitts oscillation to increase and decrease in frequency alternately as the transponder switch opens and closes. The system detects the frequency at which these frequency changes occur, which is the characteristic modulation frequency of a particular transponder.

The interrogator circuit described above is fast in operation, and can operate on a 14 MHz clock; a conventional A to D converter cannot operate at such a speed.

It is an advantage of a circuit according to the invention that, depending on the characteristics of the loop filter, the VCO correction signal can be of substantial magnitude, either in energy or in time. An optimal input to the digital signal processing unit can be supplied by providing a loop filter of appropriate characteristics.

What is claimed is:

1. An interrogator for an electronic identification system, comprising:
    a first oscillator arranged to vary in frequency in accordance with the frequency of a received signal;
    a second oscillator arranged to vary in accordance with the frequency of the first oscillator after a delay of a number of cycles of the received signal;
    phase discriminator means to detect the phase difference between respective output signals of the first and second oscillators; and
    phase-change detection means for determining the frequency at which the phase changes occur and thereby determining a modulation frequency of said received signal.

2. An interrogator according to claim 1, and further comprising a loop filter in phase discriminator means to provide said delay.

3. An interrogator according to claim 1, wherein the first oscillator is sensitive to impedance changes and the second oscillator is insensitive to impedance changes.

4. An interrogator according to claim 3, wherein the first oscillator is a Colpitts oscillator arranged to be unstable and the second oscillator is a voltage controlled oscillator.

5. An interrogator according to claim 1, and further comprising means to identify from said modulation frequency the identity of a passive transponder.

6. An interrogator according to claim 1, wherein the phase-change detection means comprises a digital filter.

7. An interrogator according to claim 6, and comprising
an input for said digital filter comprising an array of flipflop circuits;
a delay line associated with each flipflop circuit and arranged so that the time delay provided by each delay line increases incrementally along the array; and
means for providing signals from the Colpitts oscillator and the second oscillator $V_3$, $V_5$ as first and second clock signals and for providing said clock signals to each flipflop-delay line pair so that when the phase difference between the clock signals corresponds to a time which is less than the time delay provided by a delay line, the associated flipflop circuit provides a first logical output, and when said time is greater than the time delay provided by a delay line, the associated flipflop circuit provides a second logical output.

8. An interrogator according to claim 7, wherein there is further provided a second array of flipflop circuits and delay lines connected in opposition to the first array so that if the first clock signal leads the second clock signal the logical output of the first array changes and if the first clock signal lags the second clock signal the logical output of the second array changes.

9. An interrogator for an electronic identification system, comprising:
a first oscillator arranged to vary in frequency in accordance with the frequency of a received signal;
a second oscillator arranged to vary in accordance with the frequency of the first oscillator after a delay of a number of cycles of the received signal;
a phase discriminator for detecting the phase difference between respective output signals of the first and second oscillators; and
a phase-change detector for determining the frequency at which the phase changes occur and thereby determining a modulation frequency of said received signal.

* * * * *